United States Patent
Montrone et al.

(10) Patent No.: US 12,073,316 B2
(45) Date of Patent: Aug. 27, 2024

(54) METHOD FOR DETERMINING AT LEAST ONE INDICATION OF AT LEAST ONE CHANGE

(71) Applicant: Siemens Aktiengesellschaft, Munich (DE)

(72) Inventors: Francesco Montrone, Riemerling (DE); Jan Wieghardt, Munich (DE); Marc Zeller, Munich (DE); Bernhard Kempter, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 689 days.

(21) Appl. No.: 16/667,053

(22) Filed: Oct. 29, 2019

(65) Prior Publication Data
US 2020/0134457 A1    Apr. 30, 2020

(30) Foreign Application Priority Data
Oct. 30, 2018  (EP) ..................... 18203385

(51) Int. Cl.
*G06F 8/65* (2018.01)
*G06F 30/27* (2020.01)
*G06N 3/08* (2023.01)
*G06N 20/00* (2019.01)

(52) U.S. Cl.
CPC ............... *G06N 3/08* (2013.01); *G06F 8/65* (2013.01); *G06F 30/27* (2020.01); *G06N 20/00* (2019.01)

(58) Field of Classification Search
CPC .. G06N 3/08; G06N 20/00; G06F 8/65; G06F 30/27
See application file for complete search history.

(56) References Cited

U.S. PATENT DOCUMENTS

| | | | |
|---|---|---|---|
| 11,507,483 B2 * | 11/2022 | Kaukewitsch | G05B 23/0218 |
| 2009/0271346 A1 | 10/2009 | Brandes et al. | |
| 2017/0357716 A1 | 12/2017 | Bellegarda et al. | |
| 2018/0060068 A1 * | 3/2018 | Ferrara | G06F 8/65 |
| 2018/0074484 A1 * | 3/2018 | Heilmann | G05B 23/0248 |
| 2018/0095745 A1 * | 4/2018 | Mine | G06F 11/36 |
| 2018/0189055 A1 * | 7/2018 | Dasgupta | G06F 11/3692 |
| 2018/0373578 A1 * | 12/2018 | Bridges | G06N 20/00 |
| 2021/0342144 A1 * | 11/2021 | Huang | G06F 11/3688 |

OTHER PUBLICATIONS

European Search Report for application No. 2018P24489EP mailed on Apr. 18, 2019.

* cited by examiner

*Primary Examiner* — Shirley X Zhang
(74) *Attorney, Agent, or Firm* — Schmeiser, Olsen & Watts LLP

(57) ABSTRACT

Provided is a method for determining at least one indication of at least one change, having the steps of receiving at least one input data record having the at least one change and associated data, and determining the at least one indication of the at least one change by applying a learning-based approach to the at least one received input data record. The invention is also directed to a determination unit and a computer program product.

12 Claims, 2 Drawing Sheets

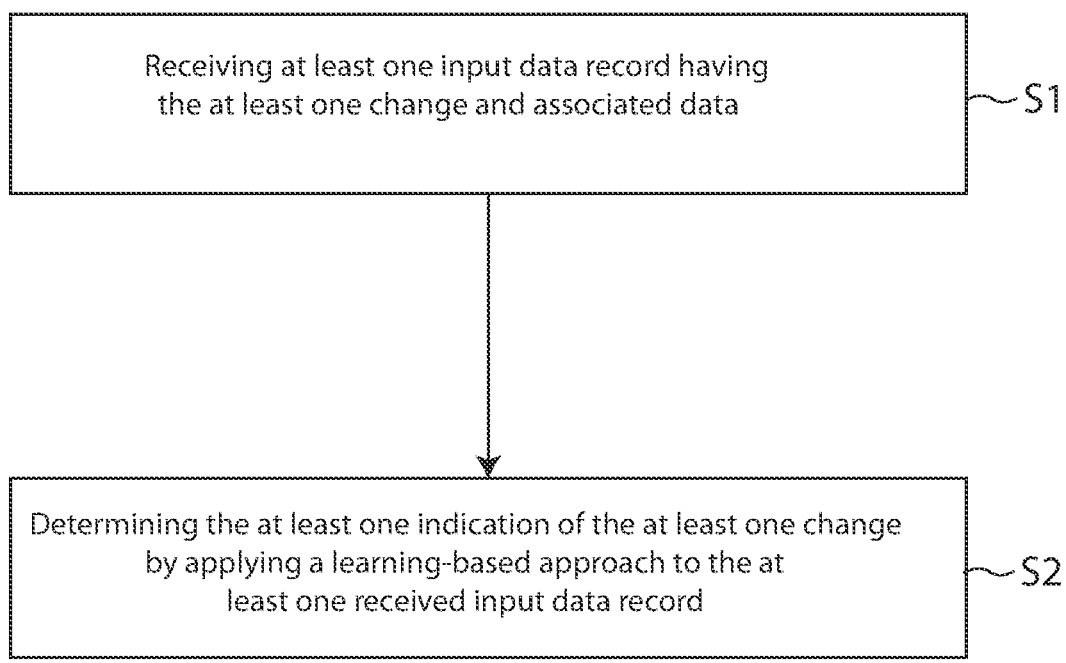

FIG 2

| Change | Description | Indication |
|---|---|---|
| `if (!isFT && nameParts.length>1) {`<br>`if (elementName.equals(".")) {`<br>`String problem = String.format("%n%n"`<br>`characters: '.' %n"`<br>`+ " -> %s in %s",`<br>`+ " - Element name contains forbidden`<br>`elementToCheck.getHumanName(),`<br>`elementToCheck.getOwner().getHumanName());`<br>`elementNameValidationResult.appendToValidationMessage(pr`<br>`oblem);`<br>`elementNameValidationResult.setIsValidationSuccessful(fa`<br>`lse);`<br>`} else if (!isFT && nameParts.length>1) {`<br>... | Bugfix of #issue 0815;<br>Integration of new check function<br>... | Yes<br>... |
| `private static TDDIPhysicalComponent createTPhysicalComponent(Property`<br>`assetUse, Map<Element, TBase> elementMap) {`<br>`private static TDDIPhysicalComponent createTPhysicalComponent(Property`<br>`assetUse, TDDIArchitecturePackage tArchitecturePackage, Map<Element,`<br>`TBase> elementMap) {` | Refactoring of method xyz | No |

12    14    20    10

METHOD FOR DETERMINING AT LEAST ONE INDICATION OF AT LEAST ONE CHANGE

CROSS-REFERENCE TO RELATED APPLICATIONS

This application claims priority to European Application No. 18203385.2, having a filing date of Oct. 30, 2018, the entire contents of which are hereby incorporated by reference.

FIELD OF TECHNOLOGY

The following relates to a computer-implemented method for determining at least one indication of at least one change. The following is also directed to a corresponding determination unit and a computer program product.

BACKGROUND

Approaches for changing software in apparatuses, installations or other systems are already known from the prior art. In the case of program-controlled apparatuses or apparatuses with software applications, there is increasingly the problem that the software is intended to or must be changed once or several times. The change to the relevant software may be required for different reasons, for example since the software is defective or requires an update.

For example, the apparatus or the installation may be an autonomous unit such as an autonomous vehicle. The vehicle may be in the form of a train or an automobile etc. The software is installed on the autonomous units. In the case of autonomous vehicles, it is necessary for the software or the associated source code, which is provided for the functionality of controlling the vehicle for example, to function in an error-free and smooth manner. By means of the control software, the autonomous vehicle can detect, for example, obstacles such as persons on the road or on the rails and can initiate the correct measures after detection. For example, the autonomous vehicle reduces the speed or comes to a standstill as soon as persons approach the vehicle.

In the case of autonomous units in particular, most software changes relate to safety-critical or safety-relevant aspects or functions of the vehicle control such as the above obstacle detection. These safety-relevant software changes must first of all be determined before they are implemented. These software changes must then be implemented. The determination and implementation must be carried out without errors in order to prevent personal and material damage. In the above error situation, if the software malfunctions, the software does not detect a person on the road or detects said person in a delayed manner and the person collides with the vehicle, during which the person is injured.

A so-called change impact analysis is usually carried out in order to determine whether the effect or the consequence of a change affects the safety such as the system safety. The analysis is carried out according to particular safety standards (for example IEC 61508) and is conventionally carried out manually.

The manual analysis is associated with the disadvantage that a considerable use of personnel is required, which is time-consuming, prone to errors and cost-intensive. A large number of changes, several hundreds, must usually be analyzed in order to determine whether their effects could potentially affect safety. With respect to the above autonomous units in particular, the number of safety-relevant changes, and therefore the volume of data, increases steadily. Another disadvantage is that there may also be a considerable period of time between the time at which the need for a software change is identified and the time at which this change is made after the complicated analysis. The apparatus cannot be operated in this period of time or can be operated only with obsolete or out-of-date software, for example without a security update.

The present embodiment of the invention is therefore based on the objective technical object of providing a method for determining at least one indication of at least one change, which method is efficient and reliable.

SUMMARY

An aspect relates to a method for determining at least one indication of at least one change, having the steps of:
a. receiving at least one input data record having the at least one change and associated data; and
b. determining the at least one indication of the at least one change by applying a learning-based approach to the at least one received input data record.

Accordingly, embodiments of the invention are directed to a method for determining an indication of a change. The indication is a tag or a reference to the presence of a particular indication of the change. The indication may also be considered to be a property. With respect to the change impact analysis, the indication indicates whether the change has an effect on the safety, in particular the operational safety or else the system safety. In other words, the method according to embodiments of the invention determines whether the change is relevant to safety before the change is implemented. The change may be an extension, a restriction or another change to a hardware unit or software application. For example, the change to a software application may be a change to a variable or an algorithm in the source code of the software.

In a first step, the input data record is received. The input data record can be received, via one or more interfaces, by the determination unit below such an autonomous unit, another software unit or a computing unit. Furthermore, the input data record has the change and further data related to this change such as the associated source code with or without the change etc., see further below.

In a second step, the indication of the change is determined. For this purpose, a learning-based approach is applied to the received input data record. For example, a neural network is used as an approach for machine learning. The neural network is usually first of all trained using indicated training data records. In other words, a training data record already has the indication in addition to the change. After this training phase, the trained neural network is used for the received input data record in order to determine the indication for a new change or a change which has not been implemented in an input data record.

The advantage is that, in contrast to the prior art, the indication of the change is determined autonomously or independently by the determination unit in an efficient manner. This makes it possible to save personnel and time. Furthermore, the determination unit is advantageously less prone to errors and is therefore more reliable. This makes it possible to reduce or even avoid the downtimes or stoppages of the underlying system or installation on which the change must be carried out. Consequently, the costs can be considerably reduced.

In one configuration, the change is an extension, a restriction or another change to a hardware unit or software. Accordingly, the change is a hardware or software change. Exemplary software changes are changes in the source code such as a change to a variable, an algorithm, individual steps of the algorithm, a data type, a name etc. In this case, changes to the algorithm are usually more relevant to safety than name changes. The change mentioned first has rather an external effect than changes which relate only to the nomenclature. These criteria can be taken into account as filter criteria in the filtering step, as explained in detail further below.

In another configuration, the input data record is stored in a storage unit, in particular in the form of a feature vector. Accordingly, the change, for example in the source code, and the indication, for example, can be considered to be features, attributes or properties. The plurality of features can also be combined as a feature vector or a series (also "array") of features. The features can be stored in an Excel table, a database, a cloud or another storage unit. Data storage has proved to be particularly advantageous with regard to efficient and reliable access to the data.

In another configuration, the associated data have a description of the at least one change and/or of the further background relating to the at least one change, in particular in a natural language. Accordingly, further associated data can be stored in the storage unit in addition to the change. The associated data are, for example, extracts from the affected source code in the case of software changes, the affected hardware units in the case of hardware changes and the description. The source code is machine-readable. In contrast, the additional description can be documented by an expert and remains readable for persons. The background may have the reason for the change and the expected or predicted effect. As a result, the associated data advantageously comprise both machine-readable data and data which are readable for persons. Furthermore, the associated data may advantageously be automatically created and/or manually created or supplemented by experts. The associated data can be expanded with information in an efficient and flexible manner.

In another configuration, the learning-based approach is selected from the group consisting of a neural network, reinforcement learning or another machine learning algorithm. Accordingly, any machine learning algorithms can be flexibly selected depending on requirements or user preferences. The neural network has proved to be particularly advantageous with regard to a large volume of data ("big data") and consequently for training with a large number of input data records. The reliability of the neural network is improved by means of continuous learning.

In another configuration, the neural network is a trained neural network. Accordingly, the method according to embodiments of the invention is carried out on the basis of the trained neural network. In other words, the change impact analysis is carried out on the trained neural network.

In another configuration, the method also has the intermediate step after step a., filtering the input data record at least partially on the basis of at least one filter criterion. Accordingly, filtering precedes the second method step b. For example, filtering can be carried out with respect to relevance or priority of the indication. The above name changes which relate only to the nomenclature have little to no relevance and are not considered in step b. Furthermore, the input data records with the changes can be determined between two software updates and only the delta can still be considered for step b. This makes it possible to save time.

In another configuration, the method also comprises determining a result value for the at least one indication of the at least one change, wherein the result value is a probability value, in particular. Accordingly, the probability of the presence of the property can be determined on the basis of the result value and its exceeding of a threshold value. The threshold value can also be referred to as a limit value and the determination can be referred to as detection or recognition. In particular, the threshold value can be flexibly adapted to requirements or other conditions. The similarity test has proved to be particularly advantageous with respect to the reliability of the method.

In another configuration, the method also comprises
approving the at least one change on the basis of the determined result value; wherein
there is approval if the result value exceeds a predetermined threshold value;
implementing the at least one change in the case of approval; and/or
initiating another measure in the case of approval or if the at least one change is rejected.

In another configuration, the other measure is a method step selected from the group consisting of
outputting and/or transmitting a message to a unit, wherein the message comprises the at least one indication, the result value, the at least one change, the associated data, other data from the input and/or output data;
implementing at least one further change, wherein the further change has already been approved.

In another configuration, the message takes into account the result value.

An aspect also relates to a determination unit for carrying out the above method.

Accordingly, the method according to the embodiment of the invention is carried out by a determination unit such as an autonomous unit. In addition to determining the indication, the autonomous unit can approve or reject the change on the basis of the result value. The determination unit can also initiate one or more other measures. For this purpose, the determination unit can carry out one or more of the steps at the same time or in succession. Furthermore, the determination unit can also proceed in steps. It can transmit a message, for example by transmitting a corresponding message or notification relating to the indication and its result value, to another unit such as a terminal, a control unit or another computing unit which takes a corresponding measure. Alternatively or additionally, the determination unit can also itself initiate the corresponding measure without another unit. As a result, the change and any other measures can be implemented efficiently and reliably without the need for a further component.

The embodiment of the invention also relates to a computer program product (non-transitory computer readable storage medium having instructions, which when executed by a processor, perform actions).

A computer program product, for example a computer program means, may be provided or delivered, for example, in the form of a storage medium, for example a memory card, a USB stick, a CD-ROM, a DVD, or else in the form of a downloadable file from a server in a network. In a wireless communication network for example, this can be carried out by transmitting a corresponding file containing the computer program product or the computer program means. A control device, for example an industrial control PC or a programmable logic controller, PLC for short, or a microprocessor for a smartcard or the like is possible as the program-controlled device, in particular.

BRIEF DESCRIPTION

Some of the embodiments will be described in detail, with reference to the following figures, wherein like designations denote like members, wherein:

FIG. 1 Shows a flowchart according to an embodiment of the invention; and

FIG. 2 Shows an exemplary training data record as an input for the learning-based approach or an output data record with the indication according to one embodiment of the invention.

DETAILED DESCRIPTION

Preferred embodiments of the present invention are described below with reference to the figures.

FIG. 1 schematically illustrates a flowchart of the method according to the embodiment of the invention with method steps S1 and S2. The individual method steps can each be carried out by the determination unit or its subunits.

FIG. 2 shows a training data record which is used as an input for the untrained learning-based approach such as a neural network. The training data record is illustrated in the form of a table. Each row comprises a training data record with the change 12 and the associated data 14. The output data record of the method according to the embodiment of the invention can likewise be output in this format or in another format.

The illustrated change 12 is a change to the source code. The illustrated associated data 14 are the description of the change, for example a general description of the change and its background such as reasons for making the change etc., as described further above in detail. Furthermore, in contrast to the input data records 10, the training data records already comprise the indications of the changes 12. The indications can be created and/or supplemented by experts. The indication 20 may provide an indication of the relevance to safety: relevant to safety (yes, true) or not relevant to safety (no, false).

The neural network is first of all trained using the existing or already available and stored training data records from FIG. 2. In other words, the neural network is trained to distinguish whether the change to the software is relevant to safety. The input data record 10 with a new change can then be analyzed by the trained neural network. The method according to the embodiment of the invention consequently determines whether the new change is relevant to safety before the change is made.

The invention claimed is:

1. A method for determining at least one indication of at least one change to a hardware or software unit of an autonomous vehicle, the method comprising:
    receiving at least one input data record having the at least one change and associated data;
    determining the at least one indication of the at least one change by applying a learning-based approach to the at least one received input data record, the at least one indication indicating whether the at least one change impacts a safety-relevant or safety critical function of a vehicle control of the autonomous vehicle before the at least one change is implemented; and
    implementing the at least one change to the hardware or software unit of the autonomous vehicle, in response to approving the at least one change;
    wherein the learning-based approach is a trained neural network that is trained to distinguish whether the at least one change is relevant to the vehicle control of the autonomous vehicle using training data records that include a change, associated data, and an indication that indicates the change is relevant to safety.

2. The method as claimed in claim 1, wherein the change is an extension, a restriction or another change to a hardware unit or software.

3. The method as claimed in claim 1, wherein the input data record is stored in a storage unit in the form of a feature vector.

4. The method as claimed in claim 1, wherein the associated data have a description of the at least one change and/or of the further background relating to the at least one change in a natural language.

5. The method as claimed in claim 1, further comprising, after the receiving, filtering the input data record at least partially on a basis of at least one filter criterion.

6. The method as claimed in claim 1, wherein, as a function of the approving the at least one change, determining a result value for the at least one indication of the at least one change, wherein the result value is a probability value.

7. The method as claimed in claim 6, wherein
    there is approval if the result value exceeds a predetermined threshold value;
    initiating another measure in the case of approval or if the at least one change is rejected.

8. The method as claimed in claim 7, wherein the other measure is a method step selected from the group consisting of
    outputting and/or transmitting a message to a unit, wherein the message comprises the at least one indication, the result value, the at least one change, the associated data, other data from the input and/or output data records;
    implementing at least one further change, wherein the further change has already been approved.

9. The method as claimed in claim 8, wherein the message takes into account the result value.

10. The method as claimed in claim 5, wherein the at least one criterion is a relevance or priority of the at least one indication indicating that the at least one change impacts safety.

11. A computer system, comprising:
    a processor;
    a memory device coupled to the processor; and
    a computer readable storage device coupled to the processor, wherein the storage device contains program code executable by the processor via the memory device to implement a method comprising:
        receiving at least one input data record having the at least one change and associated data;
        determining the at least one indication of the at least one change by applying a learning-based approach to the at least one received input data record, the at least one indication indicating whether the at least one change impacts a safety-relevant or safety critical function of a vehicle control of the autonomous vehicle before the at least one change is implemented; and
        implementing the at least one change to the hardware or software unit of the autonomous vehicle, in response to approving the at least one change;
    wherein the learning-based approach is a trained neural network that is trained to distinguish whether the at least one change is relevant to the vehicle control of the autonomous vehicle using training data records that include a change, associated data, and an indication that indicates the change is relevant to safety.

12. A computer program product, comprising a computer readable hardware storage device having computer readable program code stored therein, said program code executable by a processor of a computer system to implement a method, as claimed in claim 1 when the computer program is executed on a program-controlled device.

* * * * *